United States Patent [19]
Downey et al.

[11] Patent Number: 5,226,055
[45] Date of Patent: Jul. 6, 1993

[54] DEVICES HAVING REPETITIVE LAYERS

[75] Inventors: Stephen W. Downey, Chatham; Adrian B. Emerson, Piscataway; Rose F. Kopf, Bound Brook; Erdmann F. Schubert, New Providence, all of N.J.

[73] Assignee: AT&T Bell Laboratories, Murray Hill, N.J.

[21] Appl. No.: 767,762

[22] Filed: Sep. 30, 1991

[51] Int. Cl.$^5$ .............................................. H01S 3/08
[52] U.S. Cl. ...................................... 372/99; 372/96; 372/50; 385/14
[58] Field of Search ...................... 385/14; 372/96, 92, 372/50, 99

[56] References Cited

U.S. PATENT DOCUMENTS 5,103,494  4/1992  Mozer .................................. 385/14

OTHER PUBLICATIONS

Tai et al., "Drastic Reduction of Series Resistance in Doped Semiconductor Distributed Bragg Reflectors for Surface-Emitting Lasers", *Appl. Phys. Lett.* 56(25) Jun. 18, 1990.

"Carbon Incorporation in (AlGa)As, (AlIn)As and (GaIn)As Ternary Alloys Grown by Molecular Beam Epitaxy", I. Hiroshi and T. Ishibashi, *Japanese Journal of Applied Physics*, 30(6A), Jun., 1991, pp. L944–L947.

"Carbon doping in molecular beam epitaxy of GaAs from a heated graphite filament", R. J. Malik, R. N. Nottenberg, E. F. Schubert, J. F. Walker and R. W. Ryan, *Appl. Phys. Lett.*, 53(26), 26 Dec. 1988, p. 2661.

*Primary Examiner*—Léon Scott, Jr.
*Attorney, Agent, or Firm*—Bruce S. Schneider

[57] ABSTRACT

It has been found that in the preparation of devices having repetitive layers, such as distributed Bragg reflectors, the dopant introduced during processing redistributes itself in a deleterious manner. In particular, this dopant through various effects segregates and diffuses from one layer into the interface region of the second layer. As a result, properties such as electrical resistance of the structure become unacceptably high. By utilizing various expedients such as carbon doping this segregation and its associated deleterious effects are avoided.

7 Claims, 2 Drawing Sheets

DEVICES HAVING REPETITIVE LAYERS

BACKGROUND OF THE INVENTION

1. Field of the Invention

This invention relates to devices having repetitive layers and, in particular, to devices containing doped repetitive layers.

2. Art Background

A variety of devices are fabricated with repetitive material layers. For example, surface emitting laser diodes (SELDs) are formed from an active diode region and from adjacent multi-layered distributed Bragg reflectors. Each Bragg reflector is typically composed of a series of between 20 to 30 alternating compositional layers. The assemblage of layers constituting one reflector on one side of the active diode is doped n-type to contact the diode n-type region and the opposing second reflector is doped p-type to contact the p-type region. The materials comprising the alternating layers are chosen to have substantially different refractive indices to yield high reflectivity, and are doped to yield desired optical and electrical properties. For example, in the case of a SELD the voltage to drive the laser is conveyed through contacts to the outermost reflector region and emitted light traverses the reflector. Therefore, the doping concentration must be sufficiently high to yield a relatively high electrical conductivity, but not so high as to cause the assembly to absorb sufficient light significantly to reduce reflectivity.

Typically, for SELD devices to yield adequate optical and electrical properties, the first 1 to 5 layers (inner layers) adjacent the active region have relatively low doping ($10^{17}$ cm$^{-3}$ to $10^{18}$ cm$^{-3}$ majority carrier concentration) and the remaining area (outer layers) is intended to be fabricated with relatively high dopant concentrations, i.e., above $10^{18}$ cm$^{-3}$. The lower doping concentrations in the center of the diode (inner layers) insure that, in the region where approximately 80% of the light is confined, the free carriers do not cause absorption of more than 1% of the emitted light. Similarly, the intended dopant concentration in the remaining layers is employed in an attempt to maintain a total series resistance in the distributed Bragg reflector of less than 10Ω.

Despite these intentions, in actuality the p-type mirror in a SELD device typically has a series resistance of 100Ω or higher. This series resistance significantly constrains the voltage which must be applied to operate the device. That is, for voltages greater than 2 volts (for gallium arsenide/aluminum gallium arsenide lasers), sufficient heat is evolved to unacceptably limit device lifetime. This upper limit on voltage in turn undesirably limits the amount of useful light emitted by the laser. Attempts have been made to reduce the resistance of the reflectors by using a graded rather than an abrupt transition between adjacent semiconductor layers of the reflectors [see for example, Tai et al, *Appl. Phys. Lett.* 56, 2496 (1990)]. Despite these efforts, SELD still have unacceptable parasitic resistance, i.e., resistance greater than 100 ohms and total diode voltage, i.e., voltage greater than 2.0 V.

Thus, the commercial application of SELD devices has been substantially reduced. In particular, SELD devices are considered of particular interest for communication purposes because of their small size and relative fabrication ease (no cleaving necessary). However, the limited output intensity obtainable from such devices as a result of high series resistance, requires a relatively short distance between optical signal regenerators (repeaters) with an associated significant increase in cost. Optical transmission systems using SELDs are therefore presently not commercially desirable. Thus, such devices despite their promise are not presently used in communication systems.

SUMMARY OF THE INVENTION

It has been found that the high series resistance in multi-layered structures such as those found in SELD devices occurs due to a previously unrecognized redistribution of dopants during the fabrication process. For example, in the manufacture of SELD devices with Bragg reflectors having alternating layers of AlAs and aluminum gallium arsenide, the beryllium dopant redistributes itself in the configuration shown in FIG. 1. Although it was previously assumed that the constant beryllium flux introduced during fabrication procedures such as molecular beam epitaxy (MBE) was maintained in the growing layer, in fact, observations made on such structures with resonance ionization mass spectroscopy (RIMS) show the contrary has in fact occurred. The Be redistributes from the AlAs into the aluminum gallium arsenide. The AlAs is therefore depleted of Be dopants and of free carriers. As a result, the AlAs is excessively resistive. The newly found redistribution of dopant gives rise to high resistance originating in a region with a reduced doping concentration, i.e. a depleted dopant region, 11, in FIG. 2. Indeed it has been found that these depleted regions have majority carrier concentrations significantly lower than $10^{18}$ cm$^{-3}$. In contrast, it has also been found that majority carrier concentrations greater than $10^{18}$ cm$^{-3}$ are required to avoid undesirably high series resistance.

Various expedients are available to avoid this previously unobserved redistribution of dopants. For example, a p-type dopant such as carbon rather than beryllium is employed. The carbon dopant is less mobile than Be (with a low diffusion coefficient) in AlAs, GaAs, and aluminum gallium arsenide and is also well incorporated into both materials. Thus, redistribution does not occur and dopant concentrations well above $10^{18}$ cm$^{-3}$ are achievable. As a result, the opportunity to achieve lower series resistance in devices such as SELD devices is afforded.

DETAILED DESCRIPTION

As discussed, it has been found that for multi-layered structures conventional fabrication techniques lead to an unsuitable distribution of dopants. The consequence of this distribution is quite significant in many devices such as SELD devices. Therefore, for pedagogic reasons, the description will be in terms of such devices. However, the invention is significantly broader and extends to any multi-layered device where adjacent layers present a significantly different diffusion coefficient for the dopant entity being incorporated.

In particular, a contemplated explanation for the anomalous dopant distribution in multi-layered structures such as those having adjacent and repetitive layers of GaAs (or aluminum gallium arsenide) and AlAs involves relative diffusion mobility and miscibility factors. If compositionally distinct adjacent layers have significantly different diffusion coefficients, i.e., coefficients differing by more than a factor of 5, and if the diffusion coefficient of either layer is above $10^{-16}$ cm$^2$/sec, this dopant tends to diffuse out of the region with the higher diffusion coefficient into adjacent lower mobility regions and because of this lower diffusion constant does not substantially diffuse back to the higher mobility region. Thus, dopant concentrations are increased at interfaces on either side of the high mobility material as shown at 9 and 10 in FIG. 2 in the low diffusivity material. Additionally, if the dopant is not readily incorporated into a particular composition it tends to remain on the surface and produces an increased dopant concentration at the interface with the next layer which has higher miscibility while growth is progressing.

Figure 1:
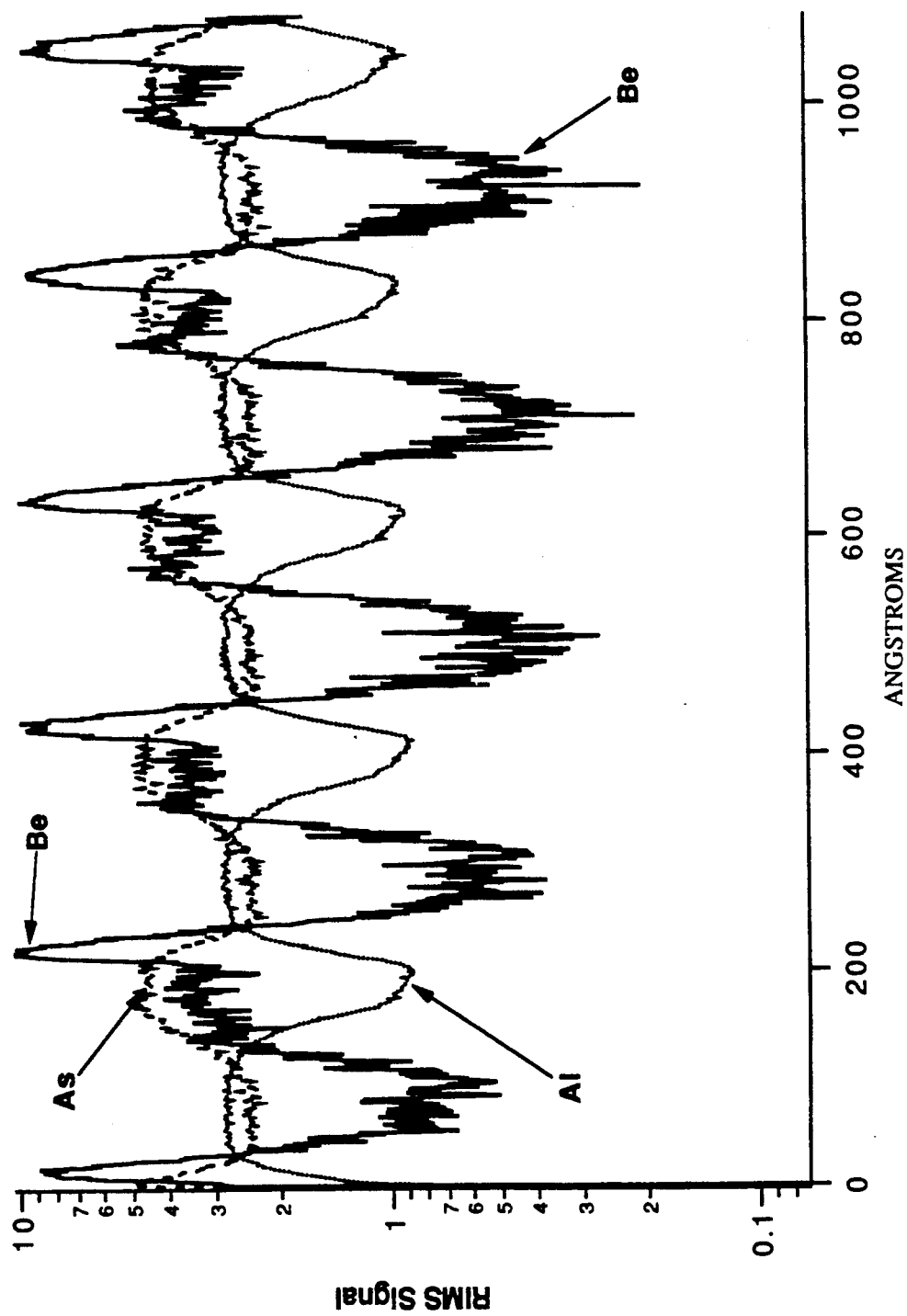
FIG. 1 is illustrative of the properties of beryllium doped devices.
Figure 2:
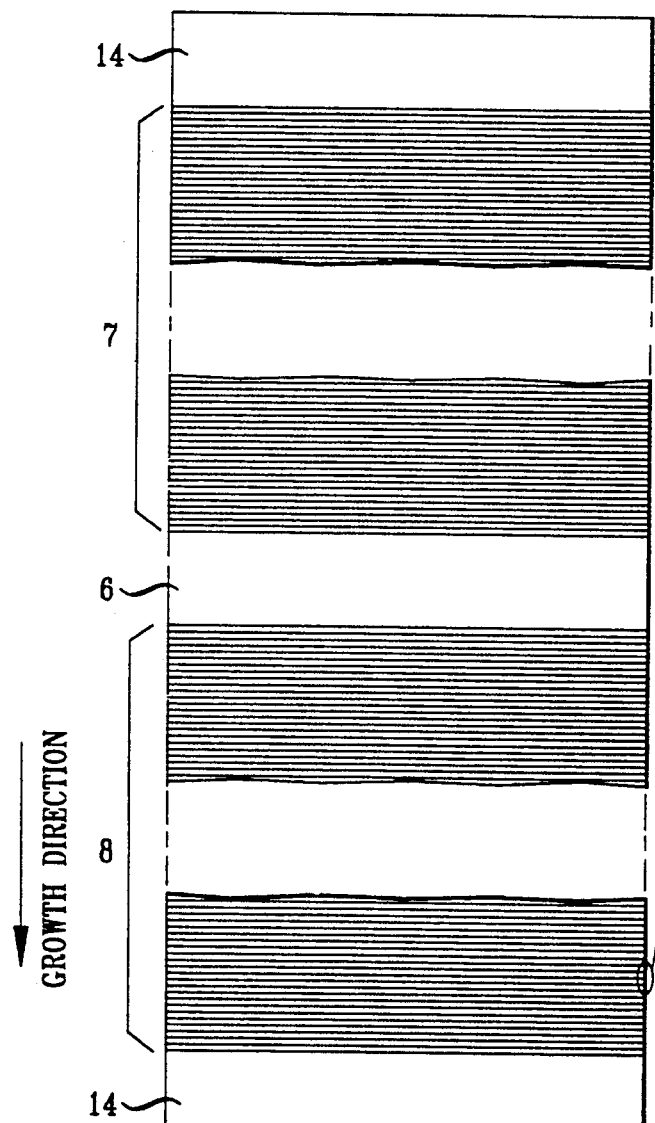
FIGS. 2-2A are illustrative of device configurations.
Figure 2A:
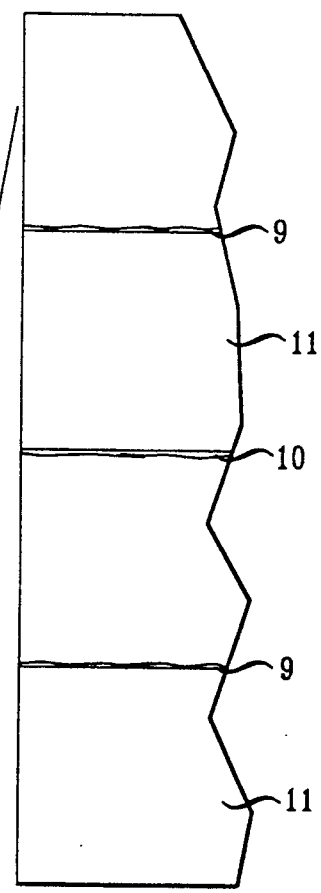

Thus, in FIGS. 2–2a, with the growth direction as indicated with 6 being the core, 7 being the n-type reflector, and 8 being the p-type reflector, region 9 of higher dopant concentration is derived from diffusion, and region 10 is derived both from diffusion and from enhanced surface concentration. As a result, region 11 (for purposes of this description denominated the "depletion region") is depleted of dopant through the spatial area that is removed at least 100 Å from the compositional interfaces. Contrary to previous wisdom in the art that dopants such as beryllium are equally incorporated throughout a device, depleted regions are in fact formed due to diffusion and surface migration in the multi-layered structure.

Clearly, depletion of dopant from the depletion region should be avoided. In particular, in any region having a diffusion constant greater than $10^{-16}$ cm$^2$/sec and a diffusion constant at least 5 times the diffusion constant in the adjacent region, appropriate measures should be taken to maintain the dopant concentration at a level greater than $10^{18}$ cm$^{-3}$ throughout the depletion region of the material affording fast diffusion i.e., region 11 in FIGS. 2–2a. An expeditious method of avoiding such depletion involves use of a dopant that incorporates well into the various layers of the structure and that does not undergo diffusion or does not undergo substantially different rates of diffusion in adjacent compositionally distinct regions. Thus, for example, in the case of a structure having alternating GaAs (or aluminum gallium arsenide) and AlAs layers, a dopant such as carbon is utilized. Carbon has an extremely low mobility in both GaAs and AlAs. The carbon incorporates well in both materials since the bond strengths of the elements involved are, in decreasing order, Al-C, Ga-C, and As-C. (See Ito, H. and Ishibashi, T., "Carbon Incorporation in (AlGa)As, (AlIn)As and (GaIn)As Ternary Alloys Grown by Molecular Beam Epitaxy", *Jpn. J. Appl. Phys.*, 30 (6A) L944 (1991).) Thus, through use of carbon it is relatively easy to maintain the desired dopant concentration without forming a depletion region.

The requisite of avoiding a depleted region is required only in regions where electrical resistance rather than optical factors are controlling, i.e., to regions to which less than 20% of the light traversing the device extends. Similarly, contact regions are also excluded. In the example of the SELD, contact regions 14 in FIG. 2 have an extremely high doping concentration for purposes of contacting external leads. Such regions are not considered for the depletion criterion. Similarly, in the case of a SELD device typically 80% of the light intensity is constrained to the five layers adjacent the active region, and only 20% of the light intensity extends beyond this region. Thus, typically in SELD devices the dopant level is maintained at a substantially lower layer in the first five layers to avoid extensive optical absorption in this region. In this region optical rather than resistance factors are controlling.

Growth of structures within the invention, i.e., structures having no dopant depletion is typically accomplished by conventional techniques such as MBE. Such techniques are well-known and are fully described in compendiums such as Parker, E. H. C., ed., "The Technology and Physics of Molecular Beam Epitaxy", Plenum Press, New York, 1985. (ISBN 0-306-41860-6) The addition of a carbon dopant is performed using carbon sources such as described in Malik, R. J., Nottenburg, R. N., Schubert E. F., Walker, J. F., and Ryan, R. W., "Carbon Doping in Molecular Beam Epitaxy of GaAs from a Heated Graphite Filament", *Appl. Phys. Lett.*, Vol. 53 (26) 2661 (1988). This carbon source is used in conjunction with specific compositional growth techniques such as described in Parker, E. H. C., ed., "The Technology and Physics of Molecular Beam Epitaxy", Plenum Press, New York, 1985. (ISBN 0-306-41860-6) for GaAs, aluminum gallium arsenide, and AlAs where dopant concentrations in the range $1 \times 10^{17}$ cm$^{-3}$ to $1 \times 10^{19}$ cm$^{-3}$ are obtained.

We claim:

1. A device comprising an active region in which light is emitted through application of a voltage a distributed Bragg reflector through which said voltage is applied, and a contact for applying said voltage through said reflector wherein said Bragg reflector comprises a plurality of p-type layers having p-type majority carriers such that adjacent layers of said plurality have different compositions and different refractive indices characterized in that the concentration of said majority carriers of said plurality of layers for layers where electrical property requirements predominate over optical property requirements, is greater than $1 \times 10^{-18}$ cm$^{-3}$ in regions removed at least 100Å from the interface between adjacent layers.

2. The device of claim 1 wherein said layers are made p-type through carbon doping.

3. The device of claim 1 wherein said adjacent layers comprise gallium arsenide and aluminum arsenide respectively.

4. The device of claim 3 wherein said layers are doped with carbon.

5. The device of claim 4 wherein said device comprises a surface emitting laser.

6. The device of claim 1 wherein said device comprises a surface emitting laser.

7. The device of claim 1 wherein said adjacent layers comprise aluminum arsenide and aluminum gallium arsenide, respectively.

* * * * *